US009847466B2

(12) United States Patent
Abe

(10) Patent No.: US 9,847,466 B2
(45) Date of Patent: Dec. 19, 2017

(54) LIGHT EMITTING DEVICE, PACKAGE, AND METHODS OF MANUFACTURING THE SAME

(71) Applicant: NICHIA CORPORATION, Anan-shi, Tokushima (JP)

(72) Inventor: Koji Abe, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/608,842

(22) Filed: May 30, 2017

(65) Prior Publication Data

US 2017/0271565 A1   Sep. 21, 2017

Related U.S. Application Data

(62) Division of application No. 14/921,706, filed on Oct. 23, 2015, now Pat. No. 9,698,324.

(30) Foreign Application Priority Data

Oct. 24, 2014   (JP) .................. 2014-217285

(51) Int. Cl.
*H01L 21/00* (2006.01)
*H01L 33/60* (2010.01)
*H01L 33/62* (2010.01)

(52) U.S. Cl.
CPC ............. *H01L 33/60* (2013.01); *H01L 33/62* (2013.01); *H01L 2224/48247* (2013.01); *H01L 2224/48257* (2013.01); *H01L 2924/181* (2013.01)

(58) Field of Classification Search
CPC ....................................... H01L 33/60
(Continued)

(56) References Cited

U.S. PATENT DOCUMENTS

2004/0061440 A1   4/2004   Imai et al.
2006/0056008 A1*  3/2006   Ito ................ G02B 26/08
                                              359/296
(Continued)

FOREIGN PATENT DOCUMENTS

JP    2004-127604 A    4/2004
JP    2004-363503 A   12/2004
(Continued)

OTHER PUBLICATIONS

Restriction Requirement issued in U.S. Appl. No. 14/921,706 dated Sep. 27, 2016.
(Continued)

*Primary Examiner* — Jami M Valentine
(74) *Attorney, Agent, or Firm* — Foley & Lardner LLP

(57) ABSTRACT

A method of manufacturing a light emitting device includes: providing an assembly comprising: a package comprising: a resin member having an inner side surface defining a recess, and a lead frame supported by the resin member and arranged at a bottom surface of the recess, and a light emitting element electrically connected to the lead frame; and forming a reflective film containing particles of a first light reflective substance on at least a portion of an outer surface of the resin member corresponding to the recess. The first light reflective substance comprises particles of a white pigment. A reflectance of the reflective film is higher than a reflectance of the resin member.

17 Claims, 12 Drawing Sheets

(58) Field of Classification Search
USPC ............................................ 257/98; 438/22
See application file for complete search history.

(56) References Cited

U.S. PATENT DOCUMENTS

| | | | | |
|---|---|---|---|---|
| 2007/0081313 | A1* | 4/2007 | Tanaka | H01L 33/486 |
| | | | | 361/767 |
| 2008/0048201 | A1 | 2/2008 | Kim et al. | |
| 2008/0210966 | A1 | 9/2008 | Sakamoto et al. | |
| 2008/0261339 | A1* | 10/2008 | Koung | H01L 33/486 |
| | | | | 438/27 |
| 2010/0025722 | A1 | 2/2010 | Wada | |
| 2013/0049045 | A1* | 2/2013 | Lee | H01L 33/486 |
| | | | | 257/98 |
| 2013/0341666 | A1* | 12/2013 | Yoshida | H01L 24/97 |
| | | | | 257/98 |
| 2014/0078738 | A1* | 3/2014 | Mori | H01L 25/0753 |
| | | | | 362/249.02 |
| 2014/0327024 | A1 | 11/2014 | Ishihara et al. | |
| 2016/0118558 | A1* | 4/2016 | Abe | H01L 33/60 |
| | | | | 257/98 |

FOREIGN PATENT DOCUMENTS

| | | |
|---|---|---|
| JP | 2007-158009 A | 6/2007 |
| JP | 2008-053726 A | 3/2008 |
| JP | 2008-160032 A | 7/2008 |
| JP | 2008-187030 A | 8/2008 |
| JP | 2009-032851 A | 2/2009 |
| JP | 2014-130903 A | 7/2014 |
| WO | WO-2013/018783 A1 | 2/2013 |

OTHER PUBLICATIONS

Non-Final Office Action issued in U.S. Appl. No. 14/921,706 dated Nov. 4, 2016.
Notice of Allowance issued in U.S. Appl. No. 14/921,706 dated Mar. 1, 2017.

* cited by examiner

LIGHT EMITTING DEVICE, PACKAGE, AND METHODS OF MANUFACTURING THE SAME

CROSS-REFERENCE TO RELATED PATENT APPLICATIONS

This application is a divisional of U.S. patent application Ser. No. 14/921,706, filed on Oct. 23, 2015, which claims priority to Japan Patent Application No. 2014-217285, filed on Oct. 24, 2014, the disclosures of which are hereby incorporated by reference in their entireties.

BACKGROUND

1. Technical Field

The present disclosure relates to a light emitting device, a package, and methods of manufacturing the light emitting device and the package.

2. Description of the Related Art

As electric appliances are increasingly miniaturized, a reduction in size and an increase in efficiency of LEDs (light emitting diodes) are advancing. Among them, as the reduction in the thickness of liquid crystal displays of television sets, personal computers, mobile phones and the like is progressing, the side-view type LEDs for the backlight with a height of 0.4 mm are now commercially available.

As a side-view type light emitting device, for example, there is known a light emitting diode package in which a light emitting diode chip is mounted in a cavity, to allow light emitted by the light emitting diode chip to be radiated in a viewing angle (for example, see JP 2008-53726 A). The light emitting diode package includes a bottom portion with a mounting region of the light emitting diode chip, a first lead terminal with one reflecting surface formed by being bent from the bottom portion, a second lead terminal spaced apart from the first lead terminal, and a package body supporting the first lead terminal and the second lead terminal.

Also there is proposed a light emitting device in which an external reflecting plate made of a thin sheet metal is provided at an outer side surface of a package (for example, see JP 2004-363503 A). There is also proposed a light emitting device in which an upper surface of a white substrate of a side-view package is cut, and a reflective film is attached to the cut plane (for example, see JP 2008-187030 A).

However, with the light emitting device disclosed in JP 2008-53726 A, it is difficult to perform bent work of the lead terminals. With the light emitting device disclosed in JP 2004-363503 A, it is difficult to perform bent work and attaching work of the thin sheet metal. The light emitting device disclosed in JP 2008-187030 A requires in addition to an increase in the manufacturing steps, accurate work in removing a portion of the package.

SUMMARY

An object of the present embodiment is to provide a light emitting device and a package that allow good light extraction efficiency, and methods of manufacturing the light emitting device and the package that can be easily carried out.

A light emitting device according to one embodiment of the present invention includes a package that includes a resin member and a lead frame, the resin member supporting the lead frame and defining a recess by a bottom surface and a side surface, the lead frame arranged at a bottom surface of the recess, and a light emitting element electrically connected to the lead frame. At least a portion of an outer side surface of the resin member defining the recess is covered with a reflective film.

A package according to one embodiment of the present invention includes a lead frame arranged at a bottom surface of a recess, and a resin member supporting the lead frame and defining a side surface of the recess. At least a portion of an outer side surface of the resin member defining the recess covered with a reflective film.

A method of manufacturing a light emitting device according to one embodiment of the present invention includes preparing a package that includes a lead frame arranged at a bottom surface of a recess and a resin member supporting the lead frame and forming a side surface defining the recess, and a light emitting element electrically connected to the lead frame, and forming a reflective film containing particles of a first light reflective substance on at least a portion of an outer side surface of the resin member defining the recess.

A method of manufacturing a package according to one embodiment of the present invention includes preparing a package that includes a lead frame arranged at a bottom surface of a recess and a resin member supporting the lead frame and forming a side surface defining the recess, and forming a reflective film containing particles of a first light reflective substance on at least a portion of an outer side surface of the resin member defining of the recess.

According to the light emitting device or the package of certain embodiments of the present invention, good light extraction efficiency can be obtained. According to the method of manufacturing a light emitting device or the method of manufacturing a package of certain embodiments of the present invention, the light emitting device or the package can be easily manufactured.

DETAILED DESCRIPTION OF EMBODIMENTS

Figure 1:
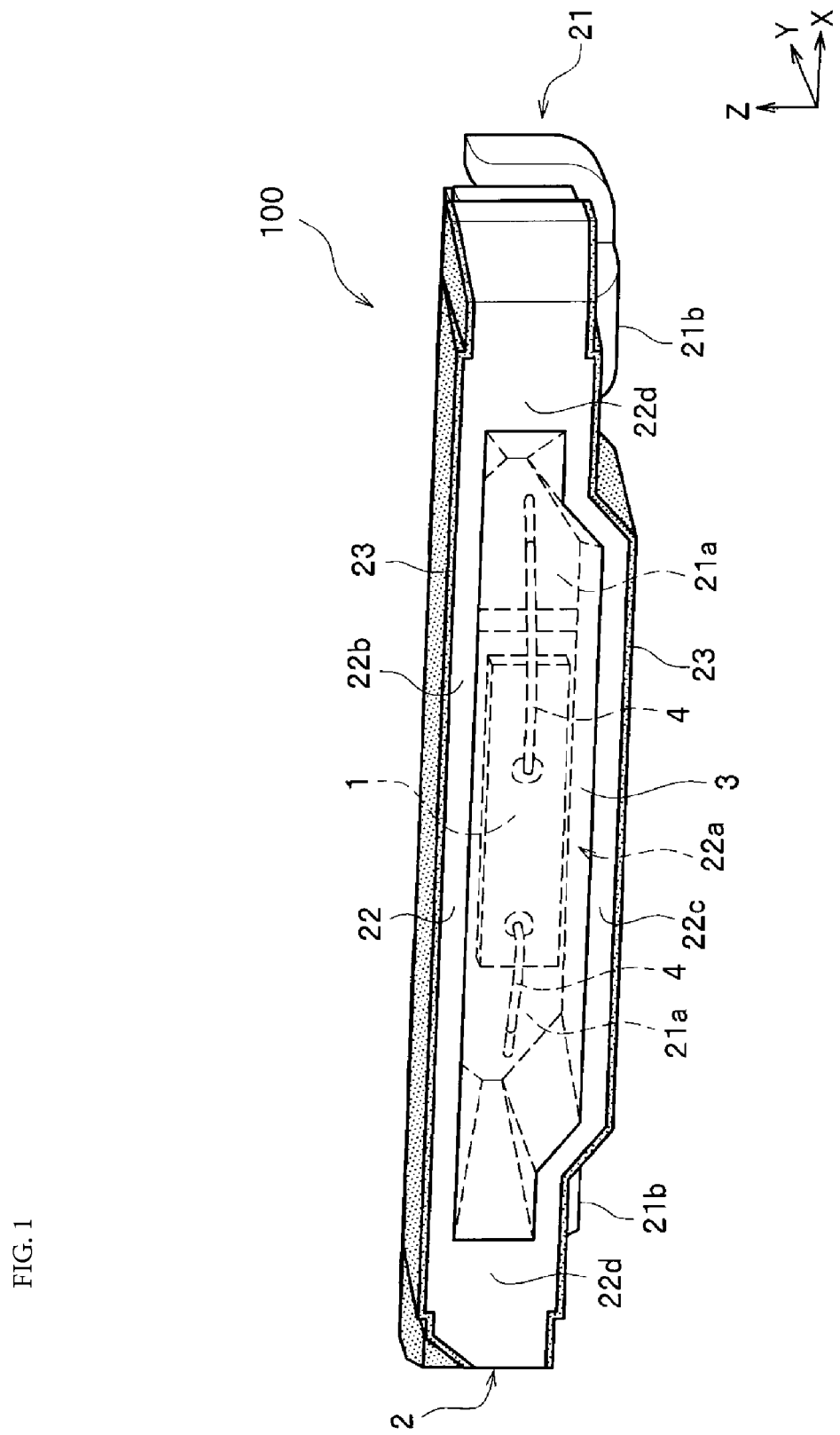
FIG. 1 is a perspective view showing the configuration of a light emitting device according to a first embodiment.
Figure 2A:
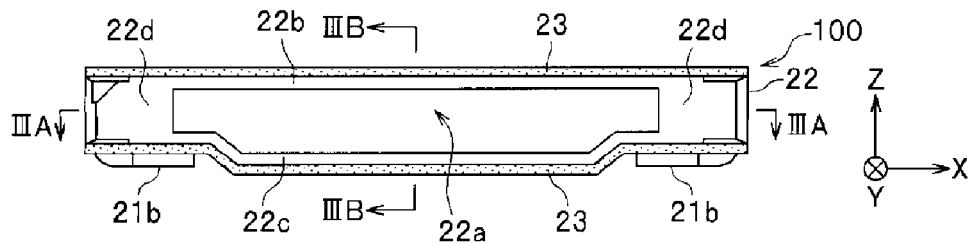
FIG. 2A is a front view showing the structure of the light emitting device according to the first embodiment.
Figure 2B:
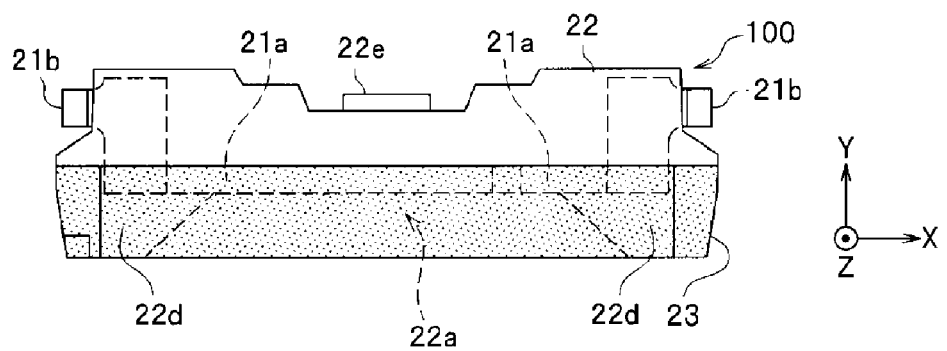
FIG. 2B is a plan view showing the structure of the light emitting device according to the first embodiment.
Figure 2C:
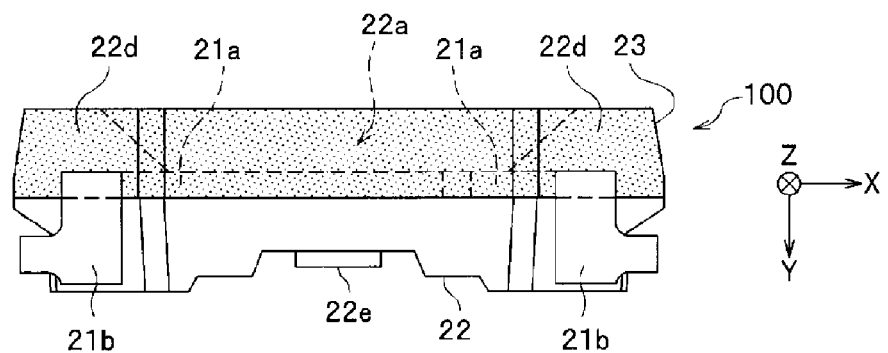
FIG. 2C is a bottom view showing the structure of the light emitting device according to the first embodiment.
Figure 2D:
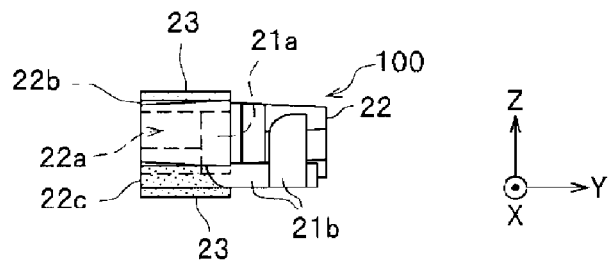
FIG. 2D is a right side view showing the structure of the light emitting device according to the first embodiment.

In the following, a description will be given of a package, a light emitting device, and methods of manufacturing the package and the light emitting device according to the present embodiment. Note that, the drawings referred to in the following description schematically show the embodiment, and thus the scale, intervals, or positional relationship of the constituent members may be exaggerated, or portion of the constituent members may not be shown. For example, between a plan view and a corresponding cross-sectional view, the scale or intervals of the constituent members may not match. Further, in the following description, identical names and reference numerals denote identical or similar constituent members on principle, and detailed description may be omitted as appropriate.

Further, in connection with the package, the light emitting device, and the methods of manufacturing the package and the light emitting device according to the present embodiment, "top/upper", "bottom/lower", "left", and "right" are to be replaced by one another according to the situation. In the present specification, "top/upper", "bottom/lower" and the like refer to the relative positions between the constituent members in the drawings referred to for an explanation, and are not intended to specify absolute positions unless otherwise stated.

[Structure of Light Emitting Device]

Figure 3A:
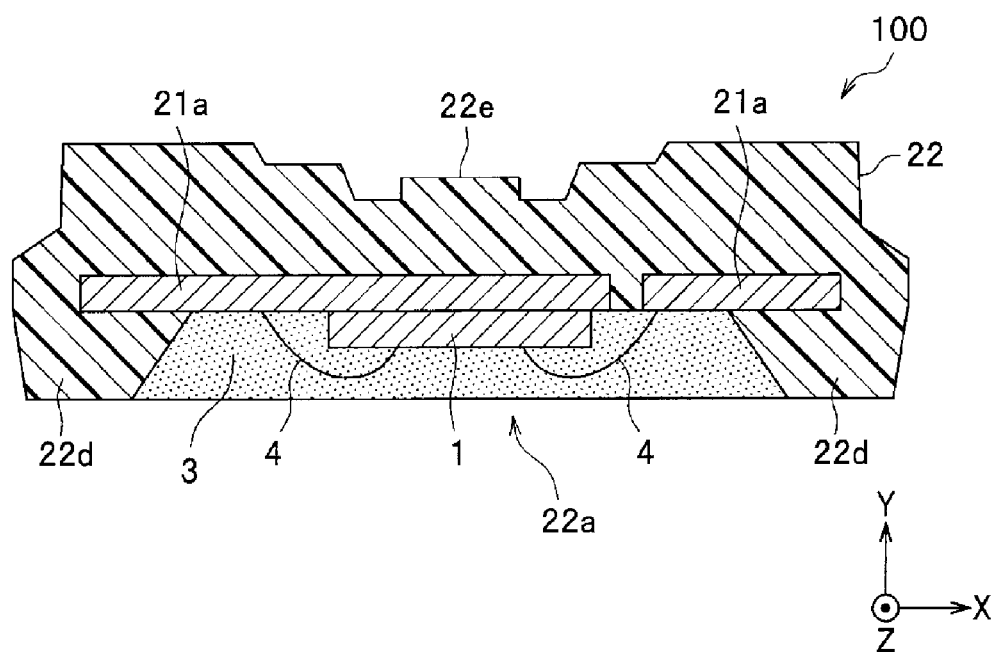
FIG. 3A is a cross-sectional view showing the structure of the light emitting device according to the first embodiment, taken along line IIIA-IIIA in FIG. 2A.
Figure 3B:
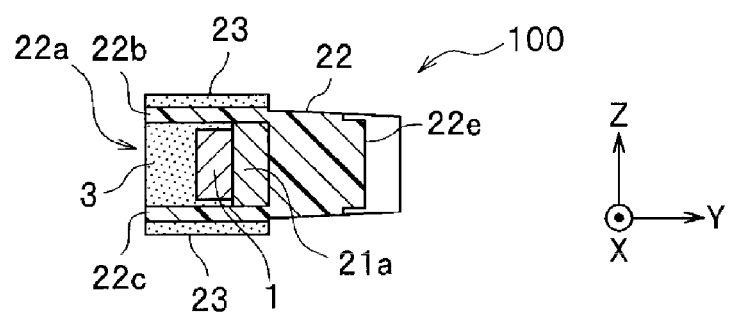
FIG. 3B is a cross-sectional view showing the structure of the light emitting device according to the first embodiment, taken along line IIIB-IIIB in FIG. 2A.

With reference to FIGS. 1 to 3B, a description will be given of the structure of a light emitting device according to an embodiment. FIG. 1 is a perspective view showing the configuration of a light emitting device according to a first embodiment. FIG. 2A is a front view showing the structure of the light emitting device according to the first embodiment. FIG. 2B is a plan view showing the structure of the light emitting device according to the first embodiment. FIG. 2C is a bottom view showing the structure of the light emitting device according to the first embodiment. FIG. 2D is a right side view showing the structure of the light emitting device according to the first embodiment. FIG. 3A is a cross-sectional view showing the structure of the light emitting device according to the first embodiment, taken along line IIIA-IIIA in FIG. 2A. FIG. 3B is a cross-sectional view showing the structure of the light emitting device according to the first embodiment, taken along line in FIG. 2A.

Note that, coordinates are shown in each of FIGS. 1 to 3B. For the sake of convenience, FIG. 2A as seen in the positive direction of Y-axis is defined as the front view; FIG. 2B as seen in the negative direction of Z-axis is defined as the plan view (top view); FIG. 2C as seen in the positive direction of Z-axis is defined as the bottom view; and FIG. 2D as seen in the negative direction of X-axis is defined as the right side view.

A light emitting device 100 according to the embodiment includes a light emitting element 1, a package 2, and a light-transmissive member 3. The light emitting element 1 is provided in a recess 22a having an opening on the front side of the package 2. Light emitted from the light emitting element 1 is output in the front direction (the negative direction of Y-axis) from the opening of the recess 22a via the light-transmissive member 3. The light emitting device 100 is formed to be flat relative to the thickness direction (the Z-axis direction) so as to be suitable for a backlight-use light source of a liquid crystal display, for example. Further, a reflective film 23 is provided at an outer surface of the resin member in the thickness direction at portions corresponding to the recess 22a. Next, each component member of the light emitting device 100 will be described in detail.

As the light emitting element 1, a semiconductor light emitting element such as an LED can be suitably used. Such a semiconductor light emitting element is suitably formed by stacking, on a substrate, a semiconductor such as ZnS, SiC, GaN, GaP, InN, AlN, ZnSe, GaAsP, GaAlAs, InGaN, GaAlN, AlInGaP, AlInGaN by using a method such as liquid phase growth, HDVPE, or MOCVD. As the semiconductor material, a gallium nitride-based semiconductor represented by $In_XAl_YGa_{1-X-Y}N$ ($0 \leq X$, $0 \leq Y$, $X+Y<1$) can be suitably used because any light emission wavelength ranging from ultraviolet light to infrared light can be selected by selecting a mixed crystal ratio.

The light emitting element 1 is joined to an inner lead portion 21a of one polarity provided at the bottom surface (the surface substantially perpendicular to the Y-axis direction) of the recess 22a of the package 2. Further, the positive and negative pad electrodes (anode and cathode) of the light emitting element 1 are electrically connected to the inner lead portions 21a of corresponding polarities, respectively, via bonding wires 4 made of Au, Ag, Cu, Al or the like. Although only one light emitting element 1 is mounted in the light emitting device 100, a plurality of light emitting elements 1 can be mounted. The plurality of light emitting elements 1 may emit light of the same color or of different colors. Further, the light emitting element 1 is sealed by the light-transmissive member 3 filled in the recess 22a.

The package 2 includes a lead frame 21, a resin member 22, and the reflective film 23. The outer shape of the package 2 is an approximately rectangular parallelepiped being flat relative to the Z-axis direction in the thickness direction which is suitable for mounting of the side-view type light emitting device suitably used for the backlight-use light source of a liquid crystal display or the like. Note that, the configuration of the package 2 is not limited to one suitable for the side-view type mounting, and a configuration suitable for the top-view type may also be employed.

The lead frame 21 includes an inner lead portion 21a, disposed to be partially exposed in the resin member 22, for mounting the light emitting element 1, and an external lead frame portion 21b projecting from the bottom surface side of the resin member 22 to serve as a terminal to be connected to the mounting substrate. Further, two lead frames 21 are disposed spaced apart with each other in the width direction (the X-axis direction) and respectively connected to their corresponding positive and negative polarities. The lead frame 21 is formed using a plate-shaped metal which may be wavy or uneven plate-shaped. The lead frame 21 may have a uniform thickness or may include a partially thick portion and/or partially thin portion.

The inner lead portion 21a is provided so as to be exposed from the resin member 22 at the bottom surface (the surface substantially perpendicular to Y-axis) of the recess 22a of the resin member 22. At the bottom surface of the recess 22a, two inner lead portions 21a are disposed spaced apart from each other, and one of them serves as the positive terminal and the other serves as the negative terminal. The light emitting element 1 is joined to the inner lead portion 21a in a state where the semiconductor layer is insulated from the inner lead portion 21a. Further, the positive and negative pad electrodes of the light emitting element 1 are electrically connected to the inner lead portions 21a of the corresponding polarities, respectively, via the bonding wires 4.

The external lead frame portion 21b continuous to the corresponding inner lead portion 21a is disposed for each polarity. The external lead frame portions 21b project from the bottom surface of the resin member 22, and are bent so as to extend toward the back surface side (the positive direction of Y-axis) along the bottom surface of the resin member 22. The external lead frame portions 21b are further bent so as to partially extend upward (the positive direction of Z-axis) along the right and left side surfaces of the resin member 22. The light emitting device 100 is mounted with the bottom surface opposed to the mounting substrate, and having the external lead frame portions 21b joined to the wiring pattern of the mounting substrate by using a conductive bonding member such as a solder.

The material of the lead frame 21 is not specifically limited, but a material of relatively great thermal conductivity is preferably used. By using such a material, the heat generated at the light emitting element 1 can be efficiently released to the outside via the external lead frame portions 21b. For the lead frame 21, a material having a thermal conductivity of, for example, about 200 W/(m·K) or greater, or a material having relatively great mechanical strength, or a material with which punching press work or etching work can be easily performed is preferably used. Specific examples of the material include a metal such as copper, aluminum, gold, silver, tungsten, iron, and nickel, or an alloy such as iron-nickel alloy and phosphor bronze. Further, the surfaces of the inner lead portions 21a exposed at the bottom surface of the recess 22a are preferably provided with reflective-plating of Ag or the like having good light reflectivity for the purpose of efficiently extracting light from the light emitting element 1 that is mounted on the inner lead portions 21a.

The resin member 22 is provided to surround the inner lead portions 21a. The resin member 22 is a base member of the package 2 for supporting the lead frame 21. The external lead frame portions 21b continuous from the inner lead portions 21a are projected from the bottom surface of the resin member 22. The external lead frame portions 21b are arranged bent along the bottom surface and the side surfaces of the resin member 22.

The resin member 22 has the recess 22a that opens on the front side (the negative direction of Y-axis) of the light emitting device 100. At the bottom surface of the recess 22a (the surface substantially perpendicular to Y-axis and oriented in the positive direction of Y-axis), the inner lead portions 21a are provided so as to be exposed. The light emitting element 1 is mounted on the surface of the inner lead portion 21a exposed from the resin member 22. Further, a gate mark 22e, which is a mark of a gate for injecting a resin material into a mold when the resin member 22 is formed by injection molding, is formed at the back surface of the resin member 22.

The resin member 22 is made of a light-reflecting material which is a light transmissive resin containing particles of a light reflective substance (a second light reflective substance) thereby possessing light reflectivity. Thus, the resin member 22 also seves as a reflective member so that in the recess 22a, light from the light emitting element 1 is reflected and efficiently emitted in the front direction. Further, the recess 22a is filled with the light-transmissive member 3.

The recess 22a has a laterally elongated opening in a front view. More specifically, the opening is defined in an octagon shape in a front view, which is made of a rectangular shape with an extending downward opening in a trapezoidal shape at a center portion of a lower side. Further, the inner lead portions 21a are provided at the bottom surface of the recess 22a. Further, the recess 22a is surrounded by an upper wall portion (a thin wall portion) 22b and a lower wall portion (a thin wall portion) 22c facing each other in the thickness direction of the light emitting device 100 (the Z-axis direction), and two side wall portions (thick wall portions) 22d facing each other in the width direction of the light emitting device 100 (the Y-axis direction).

The upper wall portion (the thin wall portion) 22b and the lower wall portion (the thin wall portion) 22c are formed thinner than the side wall portions (the thick wall portions) 22d. Further, the inner lead portions 21a provided at the bottom surface of the recess 22a is partially extended to the side of the outer surface of the lower wall portion 22c which is one of the thin wall portions, and is projected from the side of the outer surface as the external lead frame portions 21b which serves as connection terminals to the outside. The external lead frame portions 21b are further bent to extend along the lower surface of the resin member 22. As described above, the light emitting device 100 is provided with the lead frame 21 with a configuration suitable for side-view type mounting, and the resin member 22 is formed to obtain further thinner side-view type light emitting device 100.

Further, in the width direction (the X-axis direction), the side wall portions 22d each have an inner surface which is inclined such that the width of the recess 22a is widened from the bottom surface of the recess 22a where the light emitting element 1 is mounted toward the opening. Therefore, light emitted from the light emitting element 1 and propagating in the lateral direction is reflected by the inclined inner surfaces in the front direction. Note that, the inner surface of each of the upper wall portion 22b and the lower wall portion 22c is formed by a surface approximately substantially perpendicular to the bottom surface of the recess 22a without being inclined such that the light emitting device 100 has a further thin structure.

The resin material used for the resin member 22 is preferably sufficiently light-transmissive to the wavelength of light emitted from the light emitting element 1. Exemplary materials may be silicone resin, silicone-modified resin, epoxy resin, epoxy-modified resin, urea resin, phenol resin, polycarbonate resin, acrylic resin, polymethylpentene resin, polynorbornene resin, polyphthalamide resin, or hybrid resin containing at least one of the foregoing resins. Of those, silicone resin or epoxy resin is preferable, and a silicone resin having good lightfastness and heat-resistance is more preferable.

As the light reflective substance contained in the resin member 22, particles of a material having a large difference in index of refraction from the above-described resin material and exhibiting good light transmissivity are preferably used. Such a light reflective substance preferably has an index of refraction of 1.8 or more, for example. In order to efficiently scatter light and to have high light extraction efficiency, the index of refraction is preferably 2.0 or more and more preferably 2.5 or more. The difference from the resin material in index of refraction is, for example, 0.4 or more. In order to efficiently scatter light and to have high light extraction efficiency, the difference in index of refraction is preferably 0.7 or more and more preferably 0.9 or more. Further, in order to obtain the light scattering effect at high efficiency, the average particle size of particles of the light reflective substance is preferably from 0.08 μm to 10 μm inclusive, and more preferably from 0.1 μm to 5 μm inclusive.

Note that, in the present specification, the average particle size of particles of the light reflective substance, the wavelength conversion substance or the like is obtained by observation with use of an electron microscope. The average particle size is determined using a unidirectional particle diameter of the particles, in which the length in a specified axial direction is measured, and by number-based measurement (number-based distribution) in which the size of the particles is measured using an electron microscope (SEM, TEM).

More specifically, for the light reflective substance, particles of white pigment such as $TiO_2$ (titanium oxide), $ZrO_2$ (zirconium oxide), MgO (magnesium oxide), $MgCO_3$ (magnesium carbonate), $Mg(OH)_2$ (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), and $Al_2O_3$ (aluminum oxide) can be used. Of those, $TiO_2$ is preferable because $TiO_2$ is relatively stable to moisture or the like, and has a high refractive index and good thermal conductivity. Further, in order to obtain better reflectivity, $TiO_2$ is preferably employed as the light reflective substance when light emitted from the light emitting element 1 is visible light, and $Al_2O_3$ is preferably employed as the light reflective substance when the light is ultraviolet light.

Still further, the resin material contains the light reflective substance in a range not impairing moldability in forming the package. Accordingly, the content of the light reflective substance in the resin member 22 is preferably from 10 mass % to 60 mass % inclusive, and more preferably from 20 mass % to 50 mass % inclusive.

Here, as the thickness of the resin member 22 containing the light reflective substance in the range described above is thinner, the light reflectivity becomes low and the transmitted amount of incident light increases. Accordingly, the reflective film 23 is provided at the outer surface of the wall surrounding the recess 22a. Although the reflective film 23 may be provided to cover the entire outer surface of the resin member 22 surrounding the recess 22a, it is provided to cover the entire or at least portion of the upper wall portion 22b and the lower wall portion 22c serving as the thin wall portions formed to be relatively thin.

For example, in the case where the resin member 22 contains the light reflective substance by 30 mass %, the reflective film 23 is preferably provided in at least portion of a region where the thickness of the resin member 22 is 50 μm or less, at a site surrounding the recess 22a of the resin member 22. Because the amount of light transmitting through the resin member 22 is relatively great at the portion having a thickness falling within such a range, provision of the reflective film 23 in that portion contributes to improvement of the light extraction efficiency from the front direction of the light emitting device 100.

In the present embodiment, as indicated by dot-shading in FIGS. 2A to 2D, the reflective film 23 is provided so as to cover the entire upper wall portion 22b and lower wall portion 22c being the thin wall portions of the wall surrounding the recess 22a. Alternatively, the reflective film 23 may be provided only at the outer surface of the upper wall portion 22b. In this case, it is preferable to provide a reflective member such as a white resin layer or a metal film on the mounting substrate to which the lower wall portion 22c is opposed, when the light emitting device 100 is mounted on the mounting substrate.

The reflective film 23 may be a resin layer containing particles of a light reflective substance (a first light reflective substance) by a content higher than the content of the resin member 22. More preferably, the reflective film 23 is a coagulation film of particles of the light reflective substance, which is formed by causing the particles of the light reflective substance to be bound through use of a small amount of binder. The light reflective substance may be a substance similar to that contained in the resin member 22 described above. Preferably, the light reflective substance is $TiO_2$, which can attain good reflectivity in a visible light region. Although the binder may not be used, the binder is preferably used for preventing the reflective film 23 from being easily peeled off from the resin member 22. As the binder, a material exhibiting good light-transmissivity, heat-resistance, and lightfastness is preferable, and an organic material such as epoxy-base or silicone-base resin, or an inorganic material such as $SiO_2$, $Al_2O_3$, MSiO (where M is Zn, Ca, Mg, Ba, Sr, Zr, Y or the like) can be suitably used.

In order to attain good light reflectivity, the content of the light reflective substance in the reflective film 23 is preferably 60 mass % or more and more preferably 90 mass % or more. Further, in order to attain good binding force among the particles of the light reflective substance, and good adhesiveness between the particles of the light reflective substance and the resin member 22, the content of the light reflective substance is preferably 95 mass % or less. Note that, the balance of the content is mainly the component of the above-described binder.

Further, the particles of the light reflective substance may have similar particle size as those of the resin member 22 described above, and further preferably they are nanoparticles. By forming a coagulation film of nanoparticles as the reflective film 23, the reflective film 23 of reduced thickness and high reflectivity can be formed. This is suitable for reducing the thickness of the light emitting device 100. Further, by using the coagulation film of nanoparticles as the reflective film 23, a dense film that is not easily peeled off from the resin member 22 can be obtained. Thus, the light emitting device 100 of high reliability can be provided.

As to the particle size of nanoparticles, the average particle size may be in a range of 1 nm to 1000 nm inclusive, but more preferably in a range of 10 nm to 300 nm inclusive for obtaining good light reflectivity and good adhesiveness to the resin member 22.

Further, the thickness of the reflective film 23 is preferably in a range of 0.02 µm to 1.0 µm inclusive so that the film can be formed at stable thickness and good reflectivity can be obtained.

Further, the light reflective substance contained in the reflective film 23 (the first light reflective substance) and the light reflective substance contained in the resin member 22 (the second light reflective substance) may be identical to or different from each other. Still further, the particle sizes of these substances may be identical to or different from each other.

The light-transmissive member 3 is provided to pack the recess 22a of the resin member 22, and seals the light emitting element 1 mounted at the bottom surface of the recess 22a. Further, the light-transmissive member 3 may contain a wavelength conversion substance (a fluorescent material) that converts the light emitted from the light emitting element 1 into light of different wavelength. For example, by allowing the light emitting element 1 to emit blue-color light, and the wavelength conversion substance to convert portion of the blue-color light into yellow-color light, it becomes possible to allow the light emitting device 100 to emit white-color light being the mixture of the blue- and yellow-color light. The wavelength conversion substance contained in the light-transmissive member 3 may be made up of a plurality of types. In place of or in addition to the wavelength conversion substance, a light diffusing substance may be contained in the light-transmissive member 3.

As the light-transmissive member 3, a material that exhibits good light transmissivity to the wavelength of light emitted from the light emitting element 1 and to the wavelength of light emitted from the wavelength conversion substance, and that exhibits good weather resistance, lightfastness and heat-resistance as the sealing member is preferable. As such a material, a resin material similar to that employed for the resin member 22 described above, glass, or the like can be employed.

Further, as the wavelength conversion substance (the fluorescent material), any substance known in the art can be employed. Examples of the substance include a cerium-activated YAG (yttrium-aluminum-garnet)-base fluorescent material emitting green to yellow-color light, a cerium-activated LAG (lutetium-aluminum-garnet)-base fluorescent material emitting green-color light, an europium and/or chromium-activated nitrogen-containing calcium aluminosilicate ($CaO-Al_2O_3-SiO_2$)-base fluorescent material emitting green to red-color light, an europium-activated silicate ($(Sr, Ba)_2SiO_4$)-base fluorescent material emitting blue to red-color light, a sialon fluorescent material emitting green-color light, a nitride-based fluorescent material such as a CASN-base fluorescent material represented by $CaAlSiN_3$:Eu or a SCASN-base fluorescent material represented by (Sr, Ca) $AlSiN_3$:Eu emitting red-color light, a KSF ($K_2SiF_6$:Mn)-base fluorescent material emitting red-color light, and a sulfide-base fluorescent material emitting red-color light. Further, as the light diffusing substance, the above-described light reflective substance can be employed.

[Operation of Light Emitting Device]

Next, a description will be given of the operation of the light emitting device 100 with reference to FIGS. 2A to 3B. Note that, for the sake of convenience, the description will be given based on a light emitting element 1 that emits blue-color light, and a light-transmissive member 3 that contains a wavelength conversion substance that absorbs blue-color light and emits yellow-color light.

When the light emitting device 100 is connected to an external power supply via the external lead frame portions 21b, the light emitting element 1 is supplied with current further via the inner lead portions 21a and the wires 4, and the light emitting element 1 emits blue-color light. The blue-color light emitted from the light emitting element 1 is partially converted into yellow-color light by the wavelength conversion substance when propagating through the light-transmissive member 3. The light propagating in the light-transmissive member 3 in the thickness direction (the Z-axis direction) is partially reflected off into the light-transmissive member 3 by the upper wall portion 22b or the lower wall portion 22c, and the light transmitting through the upper wall portion 22b or the lower wall portion 22c is reflected off into the light-transmissive member 3 by the reflective film 23 provided at the outer surface. Further, the light propagating in the light-transmissive member 3 in the width direction (the X-axis direction) is reflected off into the light-transmissive member 3 by the side wall portions 22d, and the light propagating in the back surface direction (the positive direction of Y-axis) is reflected off into the light-transmissive member 3 by the inner lead portions 21a. The light propagating in the front direction (the negative direction of Y-axis) of the light emitting device 100 in the light-transmissive member 3 directly from the light emitting element 1 or the wavelength conversion substance or by being reflected off by the members as described above is output from the opening of the recess 22a as white-color light being the mixture of the blue-color light and the yellow-color light.

Thus, with the light emitting device 100, the light incident on the resin member 22 is returned by the reflective film 23 into the light-transmissive member 3 to be output from the opening of the recess 22a, and accordingly, the light extraction efficiency from the opening improves.

[Methods of Manufacturing Package and Light Emitting Device]

Next, a description will be given of methods of manufacturing the package 2 and the light emitting device 100.
(Method of Manufacturing Package)

Figure 4:
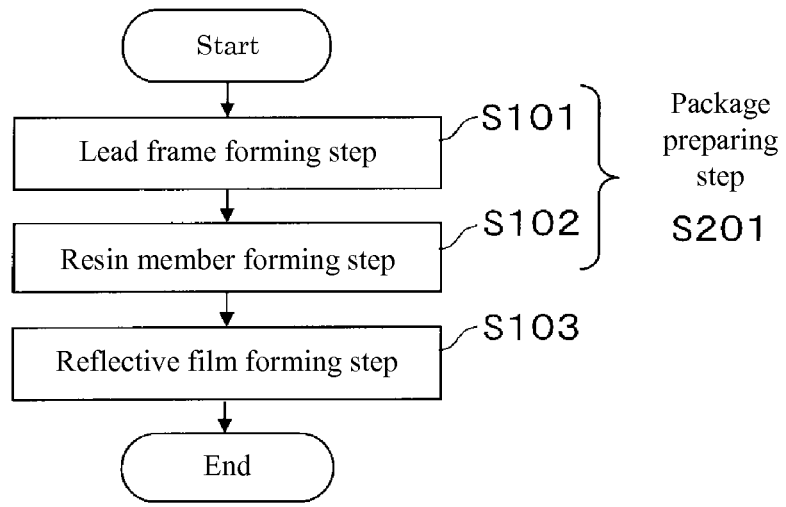
FIG. 4 is a flowchart showing the procedure of a method of manufacturing a package of the light emitting device according to the first embodiment.

Firstly, with reference to FIG. 4 (and FIGS. 1 to 3B as appropriate), a description will be given of a method of manufacturing the package 2 that is a constituent member of the light emitting device 100. FIG. 4 is a flowchart showing the procedure of the method of manufacturing the package according to the embodiment. The method of manufacturing the package 2 includes a lead frame forming step S101, a resin member forming step S102, and a reflective film forming step S103. The package 2 manufactured herein is the light emitting device 100 from which the light emitting element 1 and the light-transmissive member 3 are removed. Further, for the sake of convenience, the lead frame forming step S101 and the resin member forming step S102 are collectively referred to as a package preparing step S201. The package preparing step S201 is a step of forming the package 2 in the state before the reflective film 23 is formed.
(Methods of Manufacturing Light Emitting Device)

There are the following two methods of manufacturing the light emitting device 100, which are different in the order of a step of forming the reflective film 23 in manufacturing the package 2 and a step of mounting the light emitting element 1 on the package 2.
(First Method of Manufacturing Light Emitting Device)

Figure 5:
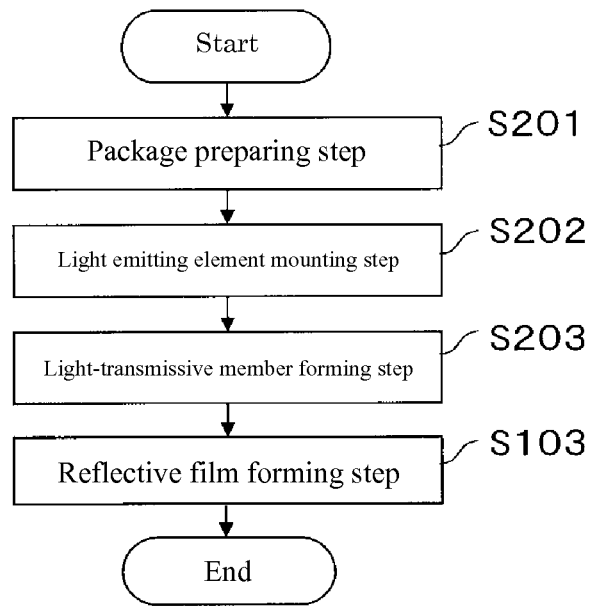
FIG. 5 is a flowchart showing a first embodiment of a method of manufacturing a light emitting device.
Figure 7A:
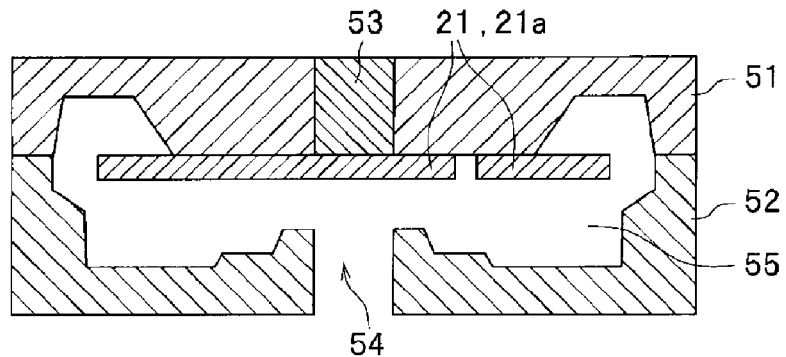
FIG. 7A is a schematic cross-sectional view showing a step of forming a resin member in the first embodiment of the method of manufacturing a light emitting device.
Figure 7B:
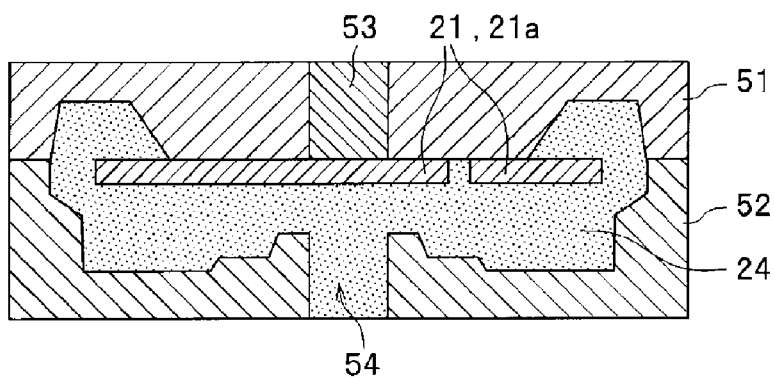
FIG. 7B is a schematic cross-sectional view showing a step of forming a resin member in the first embodiment of the method of manufacturing a light emitting device.
Figure 7C:
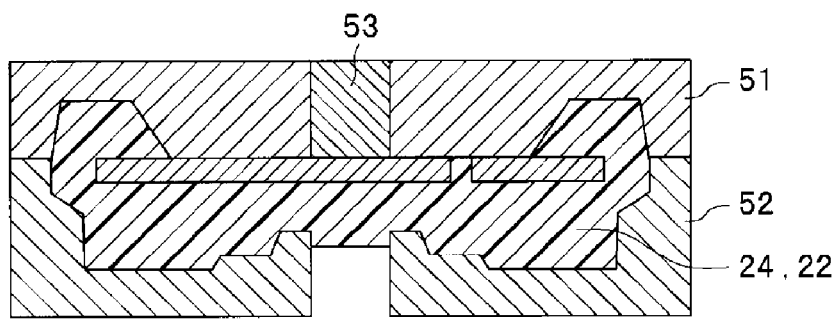
FIG. 7C is a schematic cross-sectional view showing a step of forming a resin member in the first embodiment of the method of manufacturing a light emitting device.
Figure 7D:
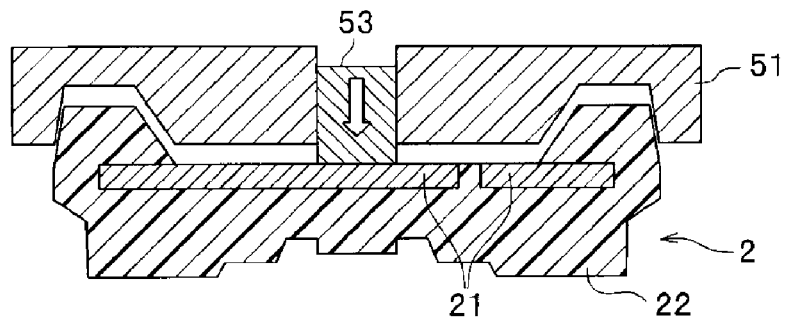
FIG. 7D is a schematic cross-sectional view showing a step of forming a resin member in the first embodiment of the method of manufacturing a light emitting device.
Figure 8A:
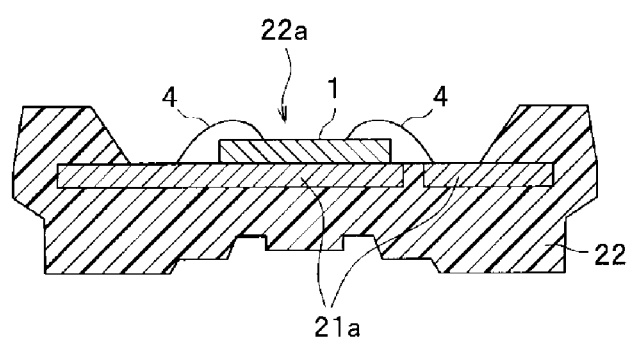
FIG. 8A is is a schematic cross-sectional view showing a step of forming a resin member in the first embodiment of the method of manufacturing a light emitting device.
Figure 8B:
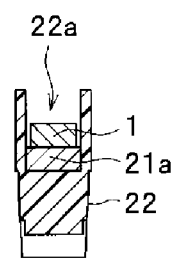
FIG. 8B is a schematic cross-sectional view showing a step of forming a resin member in the first embodiment of the method of manufacturing a light emitting device.
Figure 8C:
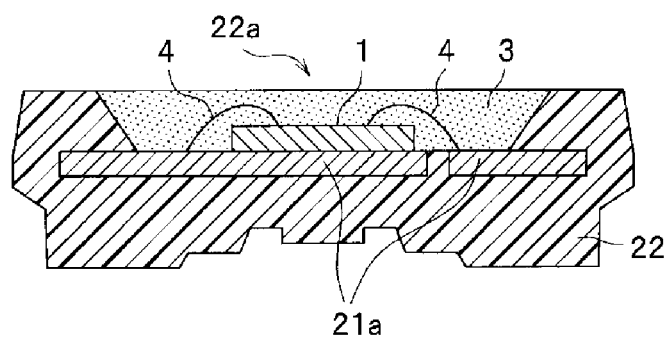
FIG. 8C is a schematic cross-sectional view showing a step of forming a resin member in the first embodiment of the method of manufacturing a light emitting device.
Figure 8D:
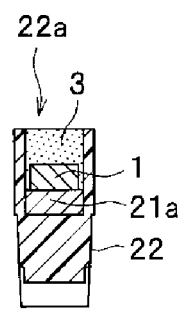
FIG. 8D is a schematic cross-sectional view showing a step of forming a resin member in the first embodiment of the method of manufacturing a light emitting device.
Figure 8E:
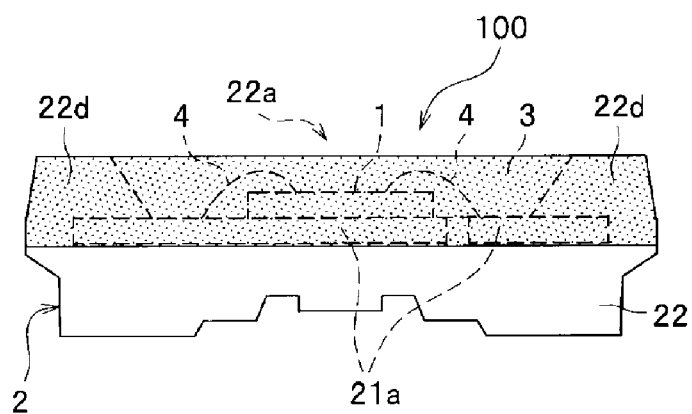
FIG. 8E is a schematic cross-sectional view showing a step of forming a reflective film is a schematic cross-sectional view showing a step of forming a resin member in the first embodiment of the method of manufacturing a light emitting device.
Figure 8F:
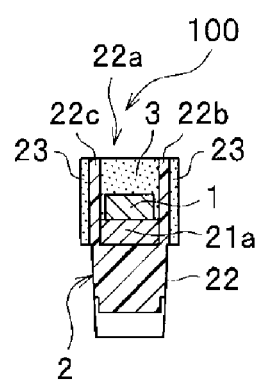
FIG. 8F is a schematic cross-sectional view showing a step of forming a resin member in the first embodiment of the method of manufacturing a light emitting device.

A description will be given of a first method of manufacturing the light emitting device 100 with reference to FIG. 5 and FIGS. 7A to 8F. FIG. 5 is a flowchart showing a first embodiment of a method of manufacturing a light emitting device. FIG. 7A is a schematic cross-sectional view showing a step of forming a resin member in the first embodiment of the method of manufacturing a light emitting device. FIG. 7B is a schematic cross-sectional view showing a step of forming a resin member in the first embodiment of the method of manufacturing a light emitting device. FIG. 7C is a schematic cross-sectional view showing a step of forming a resin member in the first embodiment of the method of manufacturing a light emitting device. FIG. 7D is a schematic cross-sectional view showing a step of forming a resin member in the first embodiment of the method of manufacturing a light emitting device. FIG. 8A is is a schematic cross-sectional view showing a step of forming a resin member in the first embodiment of the method of manufacturing a light emitting device. FIG. 8B is a schematic cross-sectional view showing a step of forming a resin member in the first embodiment of the method of manufacturing a light emitting device. FIG. 8C is a schematic cross-sectional view showing a step of forming a resin member in the first embodiment of the method of manufacturing a light emitting device. FIG. 8D is a schematic cross-sectional view showing a step of forming a resin member in the first embodiment of the method of manufacturing a light emitting device. FIG. 8E is a schematic cross-sectional view showing a step of forming a reflective film is a schematic cross-sectional view showing a step of forming a resin member in the first embodiment of the method of manufacturing a light emitting device. FIG. 8F is a schematic cross-sectional view showing a step of forming a resin member in the first embodiment of the method of manufacturing a light emitting device. Note that, FIGS. 8A and 8C are each a cross-sectional view taken along line IIIA-IIIA in FIG. 2A. Further, FIGS. 8B, 8D and 8F are each a cross-sectional view taken along line IIIB-IIIB in FIG. 2A. Still further, FIG. 8E serves as both a top view and a bottom view. In FIG. 8E, the external lead frame portions 21b are not shown.

According to the first method of manufacturing the light emitting device 100, subsequently to the package preparing step S201, the light emitting element mounting step S202 of mounting the light emitting element 1 and the light-transmissive member forming step S203 of forming the light-transmissive member 3 are performed in order, and then, the reflective film forming step S103 is performed, to complete the package 2.

Firstly, in the package preparing step S201, the package 2 in the state of being not provided with the reflective film 23 is prepared. As described above, this step includes the lead frame forming step S101 and the resin member forming step S102.

In the lead frame forming step S101, the lead frame 21 is formed. Specifically, for example, by subjecting a sheet metal to punching work, the lead frame 21 can be formed. Note that, a plurality of lead frames 21 may be formed as being connected in the plane of the sheet metal being the raw material. Further, in the present step, bending work of the external lead frame portions 21b may be performed. Alternatively, the bending work of the external lead frame portions 21b may be performed after the resin member forming step S102.

In the resin member forming step S102, the resin member 22 is formed such that the inner lead portions 21a are buried, for example, by injection molding. The resin member forming step S102 includes four sub-steps. Note that, the resin member 22 can be formed by other molding method using a mold assembly such as transfer molding, compression molding, and extrusion molding.

Firstly, as the first sub-step, the lead frame 21 formed in the lead frame forming step S101 is arranged such that the inner lead portions 21a are held between and inside an upper mold 51 and a lower mold 52. Here, the upper mold 51 is provided with an ejector pin 53 for allowing the mold product to be taken out from the upper mold 51. Further, the lower mold 52 is provided with a gate 54 for injecting a resin material. Further, a cavity 55 surrounded by the upper mold 51 and the lower mold 52 is formed into the shape of the resin member 22.

Next, as the second sub-step, a liquid resin material 24 is injected into the cavity 55 from the gate 54. Next, as the third sub-step, the resin material 24 injected into the cavity 55 is cured in the upper mold 51 and the lower mold 52, to form the resin member 22. Next, as the fourth sub-step, by removing the lower mold 52 from the mold product by shifting the lower mold 52 and then pushing the ejector pin 53 in the direction of the mold product, the mold product is taken out from the upper mold 51. From the foregoing steps, the package 2 in which the lead frame 21 and the resin member 22 are integrally molded is formed.

Next, in the light emitting element mounting step S202, the light emitting element 1 is mounted on the inner lead portion 21a exposed at the bottom surface of the recess 22a. More specifically, firstly, the light emitting element 1 is attached on the inner lead portion 21a of one polarity by die bonding. Then, the positive and negative electrodes of the light emitting element 1 and the inner lead portions 21a of the corresponding polarities are connected using the wires 4.

Next, in the light-transmissive member forming step S203, the light-transmissive member 3 is formed in the recess 22a. Thus, the light emitting element 1 is sealed. Specifically, slurry made up of the resin material, as the base member of the light-transmissive member 3, containing additive such as particles of the wavelength conversion substance or particles of the light diffusing substance is packed in the recess 22a by potting or the like. Thereafter, by allowing the resin material to cure, the light-transmissive member 3 is formed.

Next, in the reflective film forming step S103, the reflective film 23 is formed so as to cover the outer surface of the upper wall portion 22b and the lower wall portion 22c serving as the thin wall portions in the resin member 22 surrounding the recess 22a. Specifically, the slurry made up of solvent containing particles of a light reflective substance and binder is applied to the region described above, and the application film is allowed to dry. Thus, the reflective film 23 can be formed. Examples of methods of forming the reflective film 23 include potting, inkjet printing, spraying, and application with use of a brush or a sponge.

(Methods of Forming Reflective Film)

Now, a description will be given of specific examples of the methods of forming the reflective film 23.

(First Forming Method)

Figure 9A:
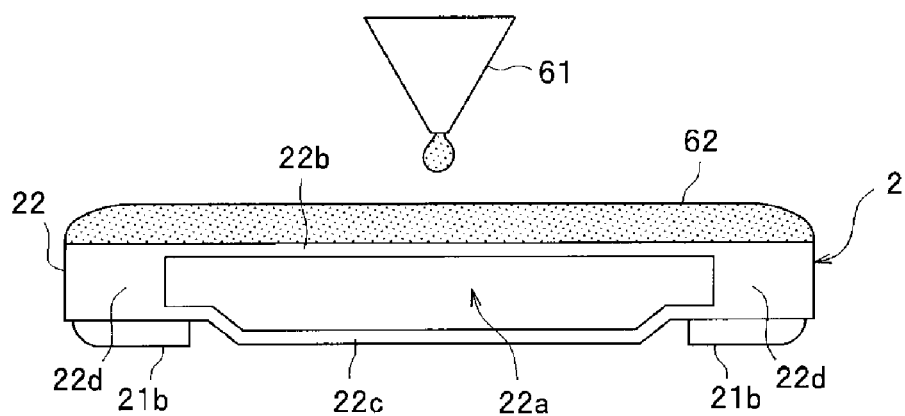
FIG. 9A is a schematic front view showing a first step of a first process for forming the reflective film in the method of manufacturing the light emitting device.
Figure 9B:
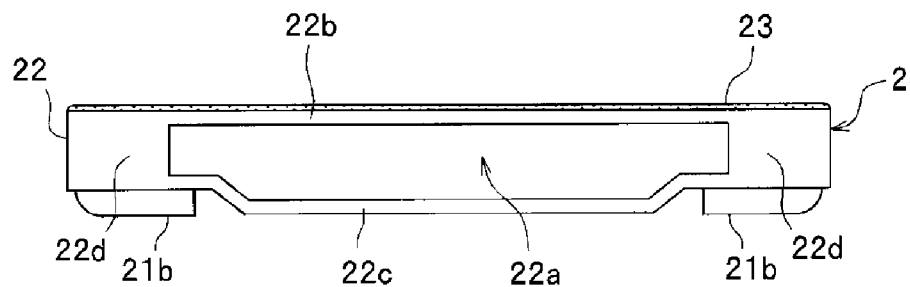
FIG. 9B is a schematic front view showing a second step of the first process for forming the reflective film in the method of manufacturing the light emitting device.

Firstly, a description will be given of the first method of forming the reflective film 23 with reference to FIGS. 9A and 9B. FIG. 9A is a schematic front view showing a first step of a first process for forming the reflective film in the method of manufacturing the light emitting device. FIG. 9B is a schematic front view showing a second step of the first process for forming the reflective film in the method of manufacturing the light emitting device. As the first method of forming the reflective film 23, potting is employed. By potting, the reflective film 23 is formed on a surface-by-surface basis. Slurry 62 made up of solvent containing particles of a light reflective substance and a binder is prepared. With use of a dispenser 61 such as a micropipet, the slurry 62 is dripped on a prescribed region, to form an application film. The application film is formed over the entire upper surface of the package 2 such that the slurry 62 rises at the end of the upper surface by surface tension. By dripping the slurry 62 so as not to spill over the side surfaces, the reflective film 23 can be formed only at the upper surface of the package 2 without masking the front side and the like of the package 2.

Next, by allowing the application film of the slurry 62 to volatilize and dry—that is, by removing the solvent—the reflective film 23 is formed. Note that, the application film can be naturally dried by setting the application film aside in a room temperature environment, or may be dried under application of heat. Further, when thermosetting resin or alkylsilicate is used as the binder, application of heat in a temperature range in which the resin material or the like of the resin member 22 does not deform or deteriorate allows the reflective film 23 to more firmly bond to the resin member 22.

Note that, the reflective film 23 may be formed by performing application and drying of the slurry 62 repetitively twice or more. Further, although it has been described that the reflective film 23 is formed at the outer surface of the upper wall portion 22b, the reflective film 23 can be formed also at the outer surface of the lower wall portion 22c. In this case, after the reflective film 23 is formed at the outer surface of the upper wall portion 22b according to the procedure described above, the package 2 is turned upside down, so that the reflective film 23 can be formed at the outer surface of the lower wall portion 22c according to the same procedure.

(Second Forming Method)

Figure 10A:
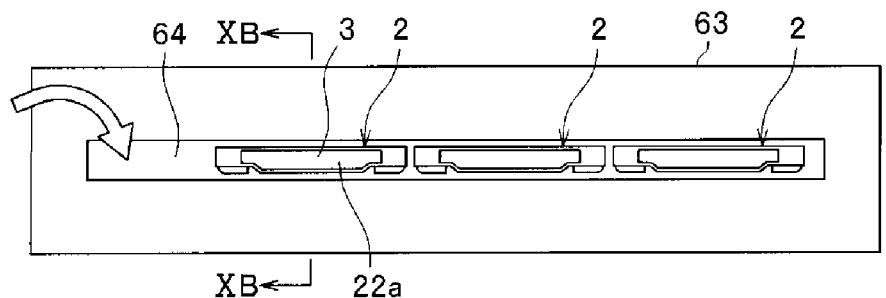
FIG. 10A is a schematic front view showing a first step of a second process for forming the reflective film in the method of manufacturing the light emitting device according to the embodiment.
Figure 10B:
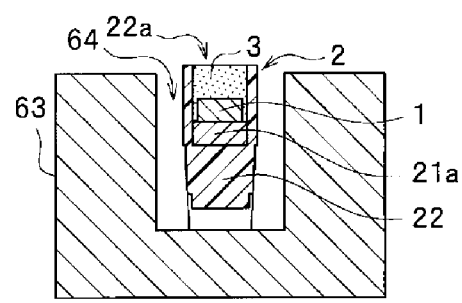
FIG. 10B is a schematic cross-sectional view showing the first step of the second process for forming the reflective film in the method of manufacturing the light emitting device according to the embodiment, taken along the line XB-XB in FIG. 10A.
Figure 10C:
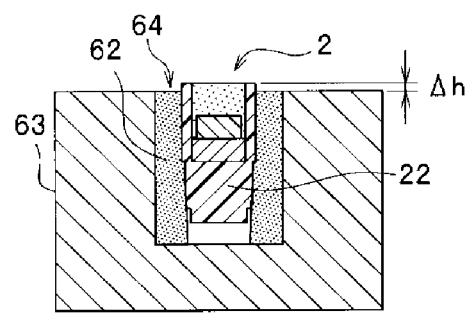
FIG. 10C is a schematic cross-sectional view showing a second step of the second process for forming the reflective film in the method of manufacturing the light emitting device according to the embodiment, taken along the line XB-XB in FIG. 10A.
Figure 10D:
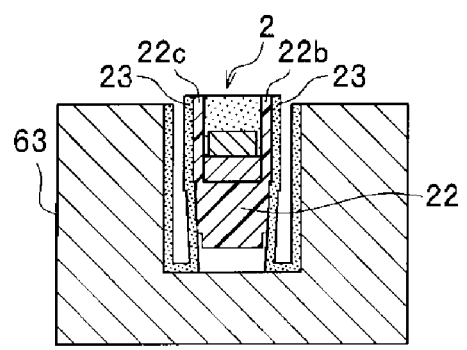
FIG. 10D is a schematic cross-sectional view showing a third step of the second process for forming the reflective film in the method of manufacturing the light emitting device according to the embodiment, taken along the line XB-XB in FIG. 10A.
Figure 10E:
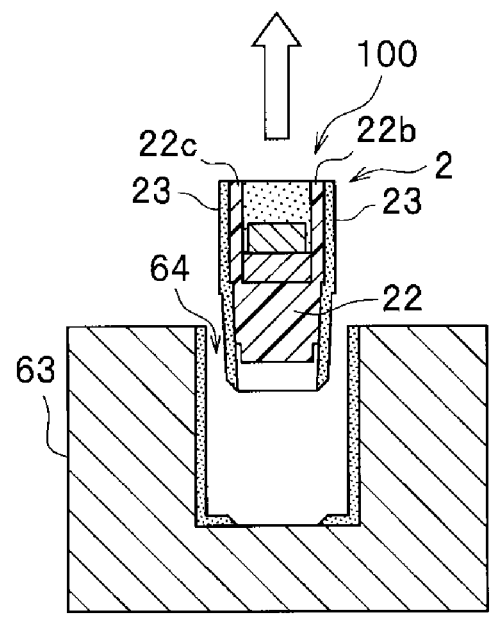
FIG. 10E is a schematic cross-sectional view showing a fourth step of the second process for forming the reflective film in the method of manufacturing the light emitting device according to the embodiment, taken along the line XB-XB in FIG. 10A.

Next, a description will be given of the second method of forming the reflective film 23 with reference to FIGS. 10A and 10E. FIG. 10A is a schematic front view showing a first step of a second process for forming the reflective film in the method of manufacturing the light emitting device according to the embodiment. FIG. 10B is a schematic cross-sectional view showing the first step of the second process for forming the reflective film in the method of manufacturing the light emitting device according to the embodiment, taken along the line XB-XB in FIG. 10A. FIG. 10C is a schematic cross-sectional view showing a second step of the second process for forming the reflective film in the method of manufacturing the light emitting device according to the embodiment, taken along the line XB-XB in FIG. 10A. FIG. 10D is a schematic cross-sectional view showing a third step of the second process for forming the reflective film in the method of manufacturing the light emitting device according to the embodiment, taken along the line XB-XB in FIG. 10A. FIG. 10E is a schematic cross-sectional view showing a fourth step of the second process for forming the reflective film in the method of manufacturing the light emitting device according to the embodiment, taken along the line XB-XB in FIG. 10A.

Firstly, on an arrangement table 63 having a groove portion 64, the package 2 is placed with its front side face up. The depth of the groove portion 64 is preferably set to be slightly shallower than the depth length of the package 2. Thus, when the package 2 is arranged in the groove portion 64 with its back surface face down, the front of the package 2—that is, the position of the opening end of the recess 22a—becomes slightly higher than the upper surface of the arrangement table 63.

Next, by pouring the slurry 62 into the groove portion 64, the surfaces of the package 2 except for the front surface is immersed in the slurry 62. The slurry 62 is poured into the groove portion 64 from a clearance where the package 2 is not arranged in the groove portion 64 as represented by an open arrow, with use of a micropipet or the like. Note that, the slurry 62 can be prepared in the same manner as in the first forming method.

Here, when the difference between the depth length of the package 2 and the depth of the groove portion 64 is Δh, Δh is preferably about 0.1 mm, for example. Thus, even when the slurry 62 is poured to the upper end of the groove portion 64, it becomes possible to more reliably prevent the opening surface of the recess 22a from being contaminated by the slurry 62.

Next, by allowing the slurry 62 poured in the groove portion 64 to dry, at the surfaces of the package 2 except for the front surface, a coagulation film of the particles of the light reflective substance can be formed as the reflective film 23. Further, the reflective film 23 is formed also in the inner surfaces of the groove portion 64. This step of pouring and drying the slurry 62 is not limited to once. Rather, pouring and drying can be repeated a plurality of times. By pouring and drying a plurality of times, the thickness of the reflective film 23 can be increased and leakage of light can be inhibited.

Note that, the width of the groove portion 64 can be determined taken into consideration of the thickness of the package 2, and the thickness of the reflective film 23 that is formed after the slurry 62 is dried.

Next, by taking out the package 2 from the groove portion 64, the package 2 provided with the reflective film 23 can be obtained. Note that, in the second forming method, the reflective film 23 is formed over the entire outer surface of the resin member 22 except for the front side, including not only the outer surfaces of the upper wall portion 22b and the lower wall portion 22c being the thin wall portions surrounding the recess 22a but also the outer surfaces of the side wall portions 22d being the thick wall portions.

(Second Method of Manufacturing Light Emitting Device)

Figure 6:
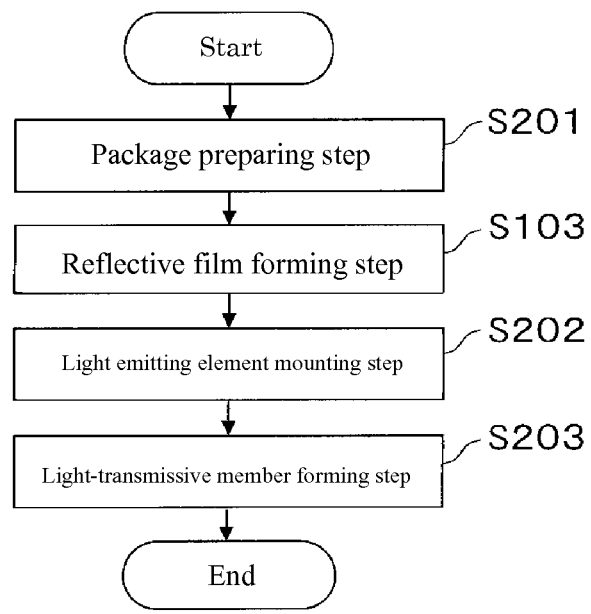
FIG. 6 is a flowchart showing a second embodiment of a method of manufacturing the light emitting device.

Next, a description will be given of the second method of manufacturing the light emitting device 100 with reference to FIG. 6. FIG. 6 is a flowchart showing the procedure of the second method of manufacturing the light emitting device according to the embodiment. According to the second manufacturing method, the package preparing step S201 and the reflective film forming step S103 are previously performed to complete the package 2, and thereafter the light emitting element mounting step S202 and the light-transmissive member forming step S203 are performed.

In the second manufacturing method, firstly, the package 2 in the state of not having the reflective film 23 is prepared in the package preparing step S201. Next, the reflective film forming step S103 is performed, and the reflective film 23 is formed at a prescribed outer surface region of the resin member 22 of the package 2 prepared in the package preparing step S201. Thus, the package 2 is completed. Next, by performing the light emitting element mounting step S202 and the light-transmissive member forming step S203 in order, the light emitting device 100 can be manufactured. Note that, the steps of the second manufacturing method are the same as the identically denoted steps of the first manufacturing method, and thus the detailed description will not be repeated.

As described above, according to any of the first manufacturing method and the second manufacturing method, the reflective film 23 can be formed on the outer surface of the resin member 22 by a simple method of applying. In the case where slurry containing nanoparticles of a light reflective substance is used, the thin reflective film 23 with good reflectivity can be simply formed. Thus, the package 2 provided with the reflective film 23 and the light emitting device 100 using the package 2 can be simply manufactured.

EXAMPLES

Next, a description will be given of Examples of the light emitting device 100 according to certain embodiments.

Example 1

A side-view type light emitting device having a shape shown in FIGS. 1 to 3B was fabricated according to the following procedure.
(1) The light emitting device 100 in which the reflective film 23 was not formed at the outer surface of the resin member 22 was prepared. Note that, the resin member 22 of the prepared light emitting device was prepared under the following conditions.
(Conditions for Fabricating Resin member)
  The light reflective substance in the resin member 22: particles of $TiO_2$ whose average particle size was 0.2 µm were added to attain a content of 30 mass %.
  The resin material for the resin member 22: polyphthalamide
  Thickness of the upper wall portion 22b and the lower wall portion 22c: 50 µm
(2) The slurry was prepared under the following conditions.
(Condition for Preparing Slurry)
  Solvent: toluene
  The light reflective substance: particles of $TiO_2$ whose average particle size was 36 nm were added to attain 0.6 mass % in the slurry.

(3) The prepared slurry was dripped onto the outer surface of the upper wall portion 22b and the lower wall portion 22c of the resin member 22 (the dot-shaded region in FIGS. 8E and 8F) according to the first method of forming the reflective film described above, and naturally dried. Thus, a coagulation film of $TiO_2$ particles was formed as the reflective film 23. Note that, formation of the reflective film 23 at the outer surface of the upper wall portion 22b and at the outer surface of the lower wall portion 22c was performed in order on a surface-by-surface basis.

In connection with a light emitting device fabricated according to the procedure described above, and with a light emitting device before formation of the reflective film 23, the light emitting element 1 mounted in the light emitting device was turned on, and the luminous flux from the front direction and the light leakage from the resin member 22 were visually inspected. As compared to the light emitting device with no reflective film 23, the light emitting device provided with the reflective film 23 showed a 2% increase in the luminous flux from the front direction, and reduced light leakage from the resin member 22 was found.

Example 2

Light emitting devices differing in the thickness of the upper wall portion 22b and the lower wall portion 22c of the resin member 22 were prepared. In the same manner as in Example 1, the reflective film 23 was formed. Further, in the same manner as in Example 1, for each of the light emitting devices of different thickness, the visual inspection of the luminous flux in the front direction and the light leakage from the resin member 22 was conducted as to the case where the reflective film 23 was formed and as to the case where no reflective film 23 was formed. Other conditions were the same as in Example 1.

With a light emitting device having a thickness of 50 µm, the effects of a 2% increase in the luminous flux in the front direction and a reduction in light leakage from the resin member 22 brought about by provision of the reflective film 23 were found. However, with the devices having a thickness of 70 µm and a thickness of 100 µm, these effects were not found.

Example 3

In connection with the conditions for forming the reflective film 23, the reflective film 23 was formed while varying the content of the light reflective substance in the slurry and the number of times of performing the application step of dripping and drying the slurry. Further, in the same manner as in Example 1, for each of the light emitting devices differing in the content of the light reflective substance in the slurry and differing in the number of times of the application step, the visual inspection of the luminous flux in the front direction and the light leakage from the resin member 22 was conducted as to the case where the reflective film 23 was formed and as to the case where no reflective film 23 was formed. Note that, other conditions were the same as in Example 1.

It was found that, as the content of the light reflective substance in the slurry was greater, and as the number of times of performing the application step was greater, the effect of an increase in the luminous flux in the front direction and the effect of reduced light leakage from the resin member 22 brought about by provision of the reflective film 23 were greater. In the first forming method in which potting is employed, when the content of the light reflective substance in the slurry was 0.3 mass %, the luminous flux was increased by 1.5%; and when 0.6 mass %, the luminous flux was increased by 2.0%. In the second forming method in which pouring and drying of slurry are employed, when the content of the light reflective substance in the slurry was 0.6 mass %, the luminous flux was increased by 0.1% when application was performed once; the luminous flux was increased by 0.2% when application was performed for three times; and the luminous flux was increased by 0.25% when application was performed for five times. One cycle of pouring and drying the slurry was regarded as one application. By increasing the number of times of application, the leakage of light was able to be inhibited, and the luminous flux was able to be increased.

Example 4

In connection with the conditions for preparing the slurry, as the binder, alkylsilicate serving as an inorganic material-base binding agent was added by 3 mass %. Further, in the same manner as in Example 1, for each of the light emitting devices differing as to whether or not the binder was added to the slurry, the visual inspection of the luminous flux in the front direction and the light leakage from the resin member 22 was conducted as to the case where the reflective film 23 was formed and as to the case where no reflective film 23 was formed. Other conditions were the same as in Example 1.

It was found that whether or not to add the binder did not change the effect of an increase in the luminous flux in the front direction and the effect of reduced light leakage from the resin member 22 brought about by provision of the reflective film 23. Thus, by addition of the binder, the reflective film 23 that is not easily peeled off from the resin member 22 can be formed without reducing these effects.

In the foregoing, the light emitting device, the package, and the methods of manufacturing the light emitting device and the package of the present invention have been specifically described based on the embodiment for carrying out the invention and its Examples. However, the spirit of the present invention is not limited to such a description, and should be broadly construed based on the scope of claims. Further, various changes and modifications based on the description are also included in the spirit of the present invention.

The light emitting device of the present embodiment can be used for various light sources, such as a backlight light source of a liquid crystal display, various illumination devices, a large-size display, various display apparatuses such as an advertisement or a destination guide, and furthermore, an image reading apparatus in a digital video camera, a facsimile, a copier, a scanner and the like, and a projector apparatus.

As described above, it should be understood that various other embodiments are possible without deporting the spirit and scope of the present invention. Accordingly, the scope and spirit of the present invention should be limited only by the following claims.

What is claimed is:
1. A method of manufacturing a light emitting device comprising:
  providing an assembly comprising:
    a package comprising:
      a resin member having an inner side surface defining a recess, and
      a lead frame supported by the resin member and arranged at a bottom surface of the recess, and
    a light emitting element electrically connected to the lead frame; and
  forming a reflective film containing particles of a first light reflective substance on at least a portion of an outer surface of the resin member corresponding to the recess,
  wherein the first light reflective substance comprises particles of a white pigment, and
  wherein a reflectance of the reflective film is higher than a reflectance of the resin member.

2. The method of manufacturing a light emitting device according to claim 1, wherein the reflective film is formed by at least one method selected from the group consisting of potting, inkjet printing, spraying, and application with use of a brush or a sponge.

3. The method of manufacturing a light emitting device according to claim 1, wherein the reflective film is formed using a slurry that includes a solvent containing particles of the first light reflective substance and a binder.

4. The method of manufacturing a light emitting device according to claim 3, wherein the step of forming the reflective film comprises:
  potting the slurry on said at least a portion of the outer surface of the resin member corresponding to the recess, and
  removing the solvent such that the reflective film is formed and bonded to the resin member.

5. The method of manufacturing a light emitting device according to claim 4, wherein the steps of potting the slurry and removing the solvent are performed by applying and drying the slurry multiple times.

6. The method of manufacturing a light emitting device according to claim 1, wherein a thickness of the formed reflective film is in a range of 0.02 μm to 1.0 μm.

7. The method of manufacturing a light emitting device according to claim 1, wherein an average particle size the first light reflective substance is in a range of 1 nm to 1000 nm.

8. The method of manufacturing a light emitting device according to claim 1, wherein the first light reflective substance comprises particles of $TiO_2$.

9. A method of manufacturing a light emitting device comprising:
  providing a package comprising:
    a resin member having an inner side surface defining a recess, and
    a lead frame supported by the resin member and arranged at a bottom surface of the recess;
  forming a reflective film containing particles of a first light reflective substance on at least a portion of an outer side surface of the resin member corresponding to the recess;
  electrically connecting a light emitting element to the lead frame; and
  covering the light emitting element with a light-transmissive member,
  wherein the first light reflective substance comprises particles of a white pigment, and
  wherein a reflectance of the reflective film is higher than a reflectance of the resin member.

10. The method of manufacturing a light emitting device according to claim 9, wherein the reflective film is formed by at least one method selected from the group consisting of potting, inkjet printing, spraying, and application with use of a brush or a sponge.

11. The method of manufacturing a light emitting device according to claim 9, wherein the reflective film is formed using a slurry that includes a solvent containing particles of the first light reflective substance and a binder.

12. The method of manufacturing a light emitting device according to claim 11, wherein the step of forming the reflective film comprises:

potting the slurry on said at least a portion of the outer surface of the resin member corresponding to the recess, and removing the solvent such that the reflective film is formed and bonded to the resin member.

13. The method of manufacturing a light emitting device according to claim 12, wherein the steps of potting the slurry and removing the solvent are performed by applying and drying the slurry multiple times.

14. The method of manufacturing a light emitting device according to claim 9, wherein a thickness of the formed reflective film is in a range of 0.02 μm to 1.0 μm.

15. The method of manufacturing a light emitting device according to claim 9, wherein an average particle size the first light reflective substance is in a range of 1 nm to 1000 nm.

16. The method of manufacturing a light emitting device according to claim 9, wherein the first light reflective substance comprises particles of $TiO_2$.

17. A method of manufacturing a package comprising:

providing a package comprising:

a resin member having an inner side surface defining a recess, and a lead frame supported by the resin member and arranged at a bottom surface of the recess; and forming a reflective film containing particles of a first light reflective substance on at least a portion of an outer side surface of the resin member corresponding to the recess, wherein the first light reflective substance comprises particles of a white pigment, and wherein a reflectance of the reflective film is higher than a reflectance of the resin member.

* * * * *